(12) United States Patent
Lai (10) Patent No.: US 8,633,722 B1
(45) Date of Patent: Jan. 21, 2014

(54) METHOD AND CIRCUIT FOR TESTING ACCURACY OF DELAY CIRCUITRY

(75) Inventor: Andrew W. Lai, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 363 days.

(21) Appl. No.: 12/894,026

(22) Filed: Sep. 29, 2010

(51) Int. Cl.
- *G01R 31/3187* (2006.01)
- *G01R 31/20* (2006.01)
- *H03K 25/00* (2006.01)
- *G01R 31/28* (2006.01)

(52) U.S. Cl.
USPC .................. 324/750.3; 324/754.07; 327/263; 327/269; 327/277; 327/261; 714/731

(58) Field of Classification Search
USPC .......................................... 324/750.3, 762.09
See application file for complete search history.

(56) References Cited

U.S. PATENT DOCUMENTS

| | | | | |
|---|---|---|---|---|
| 5,049,766 | A * | 9/1991 | van Driest et al. ............. | 327/269 |
| 5,175,452 | A * | 12/1992 | Lupi et al. ...................... | 327/262 |
| 6,025,745 | A * | 2/2000 | Lee et al. ........................ | 327/277 |
| 6,069,506 | A * | 5/2000 | Miller et al. ................... | 327/156 |
| 6,184,753 | B1 * | 2/2001 | Ishimi et al. .................... | 331/34 |
| 6,232,812 | B1 * | 5/2001 | Lee ................................. | 327/277 |
| 6,289,476 | B1 * | 9/2001 | Cowles .......................... | 714/718 |
| 7,154,259 | B2 * | 12/2006 | Miller ......................... | 324/754.07 |
| 7,154,978 | B2 * | 12/2006 | Juan et al. ....................... | 375/376 |
| 7,200,784 | B2 * | 4/2007 | Dervisoglu et al. .......... | 714/731 |
| 7,348,789 | B2 * | 3/2008 | Lee et al. ................... | 324/750.3 |
| 7,944,229 | B2 * | 5/2011 | Joshi et al. ............... | 324/762.01 |
| 2005/0134300 | A1 * | 6/2005 | Kushiyama et al. .......... | 324/763 |
| 2008/0122471 | A1 * | 5/2008 | Yamanaka ..................... | 324/763 |
| 2009/0096476 | A1 * | 4/2009 | Koyama ......................... | 324/763 |
| 2009/0261853 | A1 * | 10/2009 | Kato ............................. | 324/765 |
| 2009/0309622 | A1 * | 12/2009 | Joshi et al. ..................... | 324/763 |

\* cited by examiner

*Primary Examiner* — Jermele M Hollington
*Assistant Examiner* — Christopher McAndrew
(74) *Attorney, Agent, or Firm* — LeRoy D. Maunu (57) ABSTRACT

In one embodiment a circuit for testing delays is provided. A test signal generator circuit toggles a plurality of output signals 1 through N in sequential order, separating the toggles by a delay period. Each output signal is coupled to an input of a respective one of a plurality of delay circuits. A phase detector circuit is coupled to the delay circuits and is configured to determine the order in which signals output from delay circuits X−1, X, and X+1 are toggled for each delay circuit X. In response to the output signals being toggled in the order X−1 followed by X followed by X+1, the phase comparator circuit is configured to output a first signal indicating correct operation. Otherwise, the phase comparator circuit is configured to output a second signal indicating incorrect operation.

17 Claims, 6 Drawing Sheets

METHOD AND CIRCUIT FOR TESTING ACCURACY OF DELAY CIRCUITRY

FIELD OF THE INVENTION

One or more embodiments of the invention generally relate to testing of electronic circuits and more particularly relates to testing delay components of integrated circuits.

BACKGROUND

The minimum dimension that a given photolithography process can resolve is alternatively called the minimum feature-size or the critical dimension. The feature-size is a parameter of interest as reductions in the feature-size tend to improve speed performance of the IC. The feature-size of a printed integrated circuit (IC) is not uniform. The printing process results in slight variation of the feature-size from lot-to-lot, from wafer-to wafer, and from device to device within each wafer. As a result, programmable ICs, such as field programmable gate arrays (FPGAs) may experience variations in static power and circuit delay due to variations in the manufacturing process.

Switching speed is not uniform throughout a particular die or from die-to-die. Some manufacturing variations may consistently result in circuit elements in different regions of a die having different switching speeds. These types of variations are referred to as systematic variations. Other manufacturing variations are unpredictable and are characterized as random variations. Random variations may cause variation between dies for a particular location. Random variations may be due to lithography, masking or some other process required in the manufacturing of the integrated circuit devices.

In integrated circuit design, it is often important to synchronize timing in which signals are received by different components. For example, a long signal path between a digital clock manager and data load can cause clock delay, and the signal path may require adjustment in order to synchronize input setup and hold times and provide proper data transfer. Delay circuits are often used to perform this adjustment.

Due to variations in switching speed, two programmable delay circuits on a particular die of a programmable IC may not provide precisely the same phase shift. As the speed of ICs is increased and input setup and hold time windows decrease, a higher degree of accuracy is required for delay circuitry. In order to allow developers to simulate and test circuit designs on target devices using precise propagation timing prior to circuit realization, many programmable IC vendors measure switching speed of several printed devices of a product design to verify correct operation and/or determine accuracy that can be guaranteed to designers. The presence of process variations degrades accuracy and/or operational speed that can be guaranteed to customers.

Automated test equipment (ATE) is often utilized to test the performance of manufactured programmable IC dies in a production environment. ATE may be used to directly measure various individual circuits of an IC in the production environment. In another approach, built-in self-test (BIST) circuits may be implemented to internally test delay circuits by specially configuring a programmable device and measuring the propagation delay related to such a device without using an ATE to directly measure the delay. One BIST implementation configures programmable logic to implement a ring oscillator and a counter to count cycles of the ring oscillator. The counter is configured to provide the ATE with the count of the oscillator's cycles, which can be used to determine the propagation delay of the tested delay circuit under test.

These methods for measuring delay time on the automated test equipment (ATE) are not practical because each delay circuit under test must be measured individually making overall testing time prohibitively long.

One or more embodiments of the present invention may address one or more of the above issues.

SUMMARY

In one embodiment, a circuit for testing a plurality of delay circuits is provided. A test signal generator circuit is configured to generate a plurality of output signals 1 through N, and in response to an input signal, toggle the plurality of output signals in sequential order from 1 to N with a delay period between the toggle of each output signal X and the toggle output signal X+1 of the N output signals. Each output signal is coupled to an input of a respective one of the plurality of delay circuits. A phase detector circuit is coupled to outputs of the delay circuits. In response to the output signals being toggled in the order X−1 followed by X followed by X+1, the phase comparator circuit is configured to output a first signal indicating correct operation of delay circuit X. Otherwise, the phase comparator circuit is configured to output a second signal indicating incorrect operation of delay circuit X.

In another embodiment, a method for testing delay circuits is provided. Input signals to a plurality of N delay circuits are toggled in sequential order from 1 to N, with a delay period between the toggle of the input signal to each delay circuit X and the toggle of the input signal to delay circuit X+1 of the plurality of delay circuits. For each delay circuit X of delay circuits 2 through N−1, an order in which output signals of delay circuits X−1, X, and X+1 toggle is determined. In response to the output signals of delay circuits X−1, X, and X+1 being toggled in the order X−1 followed by X followed by X+1, a first data value indicating delay circuit X is operational is stored. In response to the output signals of delay circuits X−1, X, and X+1 being toggled in an order other than X−1 followed by X followed by X+1, a second data value indicating delay circuit X is not operational is stored.

In yet another embodiment, an article of manufacture is provided. The article is characterized by a non-transitory storage medium configured with configuration data that when loaded onto a programmable integrated circuit cause a set of programmable circuits to operate as built in self test (BIST) circuits. The BIST circuitry is configured to toggle input signals to a plurality of N delay circuits in sequential order from 1 to N, with a delay period between the toggle of the input signal to each delay circuit X and the toggle of the input signal to delay circuit X+1 of the plurality of delay circuits. For each delay circuit X of delay circuits 2 through N−1, the BIST circuits are configured to determine an order in which output signals of delay circuits X−1, X, and X+1 toggle. In response to the output signals of delay circuits X−1, X, and X+1 being toggled in the order X−1 followed by X followed by X+1, the BIST circuits are configured to output a first data value indicating delay circuit X is operational. In response to the output signals of delay circuits X−1, X, and X+1 being toggled in an order other than X−1 followed by X followed by X+1, the BIST circuits are configured to output a second data value indicating delay circuit X is not operational.

It will be appreciated that various other embodiments are set forth in the Detailed Description and Claims, which follow.

BRIEF DESCRIPTION OF THE DRAWINGS

Various aspects and advantages of the disclosed embodiments will become apparent upon review of the following detailed description and upon reference to the drawings in which.

DETAILED DESCRIPTION OF THE DRAWINGS

Testing of programmable or fixed delay blocks is difficult because the time delays involved are very short, typically in the range of tens of pico-seconds. Measuring these time delays using automated test equipment (ATE) is not practical because each delay circuit has to be measured individually and the test time is prohibitively long. Current methods utilize a built-in self-test (GIST) which puts the delay circuit into a test mode. The test mode incorporates each delay circuit into a respective ring oscillator and measures the oscillation frequency. The oscillation frequency monotonically increases or decreases in comparison to the previously measured frequency as the delay setting is increased or decreased. Although this method provides better results than direct measurement, the test is long and will not detect longer than normal delays in a particular setting of the delay block. One or more embodiments of the present invention provide methods and circuits for efficiently testing multiple delay circuits. These embodiments can be implemented to identify faulty delay circuits or determine accuracy of programmable delay circuits in a production environment.

Figure 1:
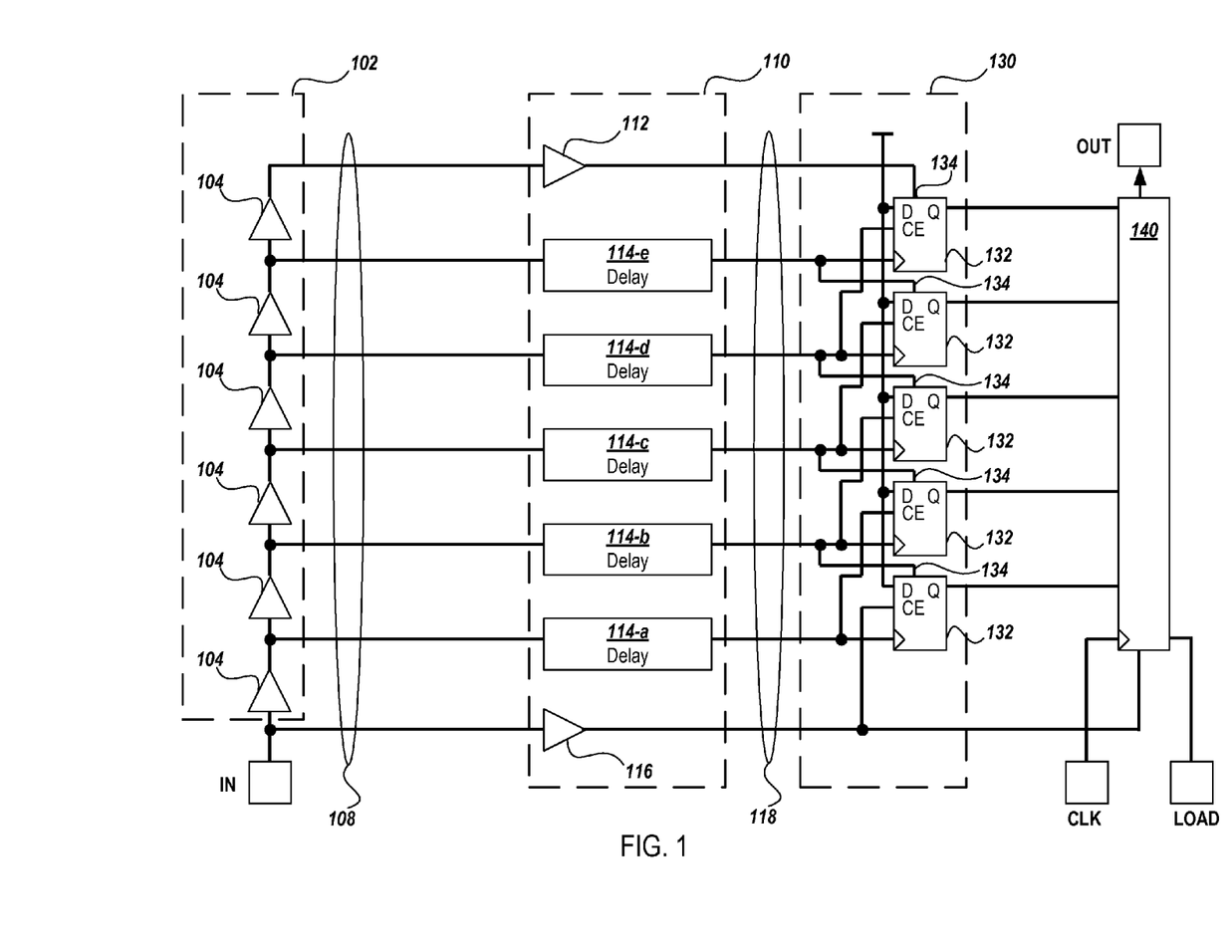
FIG. 1 shows a block diagram of a circuit for testing delay circuits in accordance with one or more embodiments of the invention.

In one embodiment, the output signals of multiple delay circuits are compared to identify delay circuits showing discrepant propagation delays. FIG. 1 shows a block diagram of a circuit for testing delay circuits. The circuit includes a plurality 110 of delay circuits, which include a number of delay circuits under test 114-a-114-e. Delay buffer circuits 112 and 116 are included to provide an output signal for comparison with respective ones of the delay circuits under test 114-a-114-e but are not themselves tested. The plurality of delay circuits are driven by waveform generation circuit 102, which is configured to sequentially toggle input signals 108 to the plurality of delay circuits 114-a-114-e. For ease of explanation, individual ones of signals 108 and corresponding delay circuits 114-a-114-e in the plurality 110 of delay circuits are referred to as input signal X and delay circuit X, where X designates the order in which the delay circuits are toggled. In this example, having five delay circuits under test 114-a-114-e, the input signals to the plurality of delay circuits are toggled in a sequential order beginning with the input signal to delay buffer circuit 116 (X=1), continuing with the input signal to the five delay circuits 114-a, 114-b, 114-c, 114-d, and 114-e (X=2, 3, 4, 5, 6, respectively), and ending with the input signal to delay buffer circuit 112 (X=7).

The toggle of each input signal X input to delay circuit X occurs at a selected delay period following the toggle of the previous delay circuit X−1. If there is no discrepancy between delay circuits X and X−1, the output of delay circuits X should toggle at the selected delay period following the toggle of the output of delay circuits X−1. In the example implementation shown, test waveform generation circuit 102 sequentially toggles the output signals 108 using a chain of buffer delay circuits 104. The buffer delay circuits 104 delay each successive output signal by the propagation delay ($\Delta t$) introduced by each buffer delay circuit 104. In this manner, the toggle of the input signal to delay circuit X is $\Delta t$ after the toggle of the input signal to delay circuit X−1 and $\Delta t$ before the toggle of the input signal to delay circuit X+1. One skilled in the art will recognize that waveform generation circuit 102 may be implemented in a number of other ways to sequentially toggle the input signals to the plurality of delay circuits.

In this example, phase comparison circuit 130 identifies discrepancies between compared delay circuits by detecting when the output signals of the delay circuits do not toggle in sequential order. If there is no discrepancy in the propagation delay of the delay circuits (e.g. each delay circuit has the same propagation delay), the output signals are expected to toggle in the same order as the toggling of the input signals to the delay circuits. If the output signals of any two delay circuits toggle out of order, a discrepancy is detected.

For purposes of clarity, the order in which the output signal from a delay circuit X toggles with respect to the toggling of the output signals from delay circuits X−1 and X+1 is referred to as the phase of the delay output. If the output signals from the delay circuits toggle in the order X−1, followed by X, followed by X+1, the phase of delay circuit X is considered correct. If X toggles before X−1, the phase of circuit X is referred to as early, and if X toggles after X+1, the phase of circuit X is referred to as late.

The sensitivity of the detection is determined by the period of time between the sequential toggling of the input signals to the delay circuits. The smaller the time period between the sequential toggles, the more sensitive the detection circuit will be to discrepancies. In the illustrated implementation, the sensitivity is determined by the propagation delay of buffer circuits 104.

Phase comparison circuit 130 compares the output signals 118 of the plurality of 110 delay circuits to determine the phase of each delay circuit under test 114 with respect to two other delay circuits. In performing the phase comparison, delay buffer circuits 116 and 112 act as respective delay circuits X=1 and X=7. In the illustrated implementation, the phase comparator circuit 130 includes a flip-flop 132 for each delay circuit under test (2×6). The flip-flop has a clock input coupled to the output of the corresponding delay circuit X, a clock enable input (CE) coupled to the output of delay circuit X−1, and a synchronous reset 134 coupled to the output of delay circuit X+1.

If the phase of delay circuit X is correct (e.g. toggle order=X−1, X, X+1) the CE of the corresponding flip-flop will be enabled before the rising/falling edge of the toggled signal output from the delay circuit reaches the clock input. As a result, the flip-flop will be loaded with the value of 1 through data input D. The synchronous reset 134 will be enabled after the edge of the toggled signal output from the delay circuit and therefore will have no effect. If the phase of the delay circuit X is early (e.g., toggle order X before X−1), the CE input will not be enabled when the rising/falling edge of the toggled signal reaches the clock input. As a result, the flip-flop will remain at the initialized value (indicating error). If the phase of the delay circuit X is late (e.g., toggle order X+1 before X), the synchronous reset input 134 will be enabled and will be triggered when the rising/falling edge of the signal at the clock input is received. As a result, the value stored in the flip-flop will be reset to the initialized value (indicating an error).

After the output signal of delay buffer circuit 112 is toggled, the test is complete and results can be read from phase comparison circuit 130. In this example, the results from the plurality of flip-flops 132 are output in parallel and converted to serial output by outputting the results to parallel-loadable, serial-in-serial-out shift register 140.

One skilled in the art will recognize that the waveform generation circuit 102 and phase comparison circuit 130 may be implemented in a number of ways.

Figure 2:
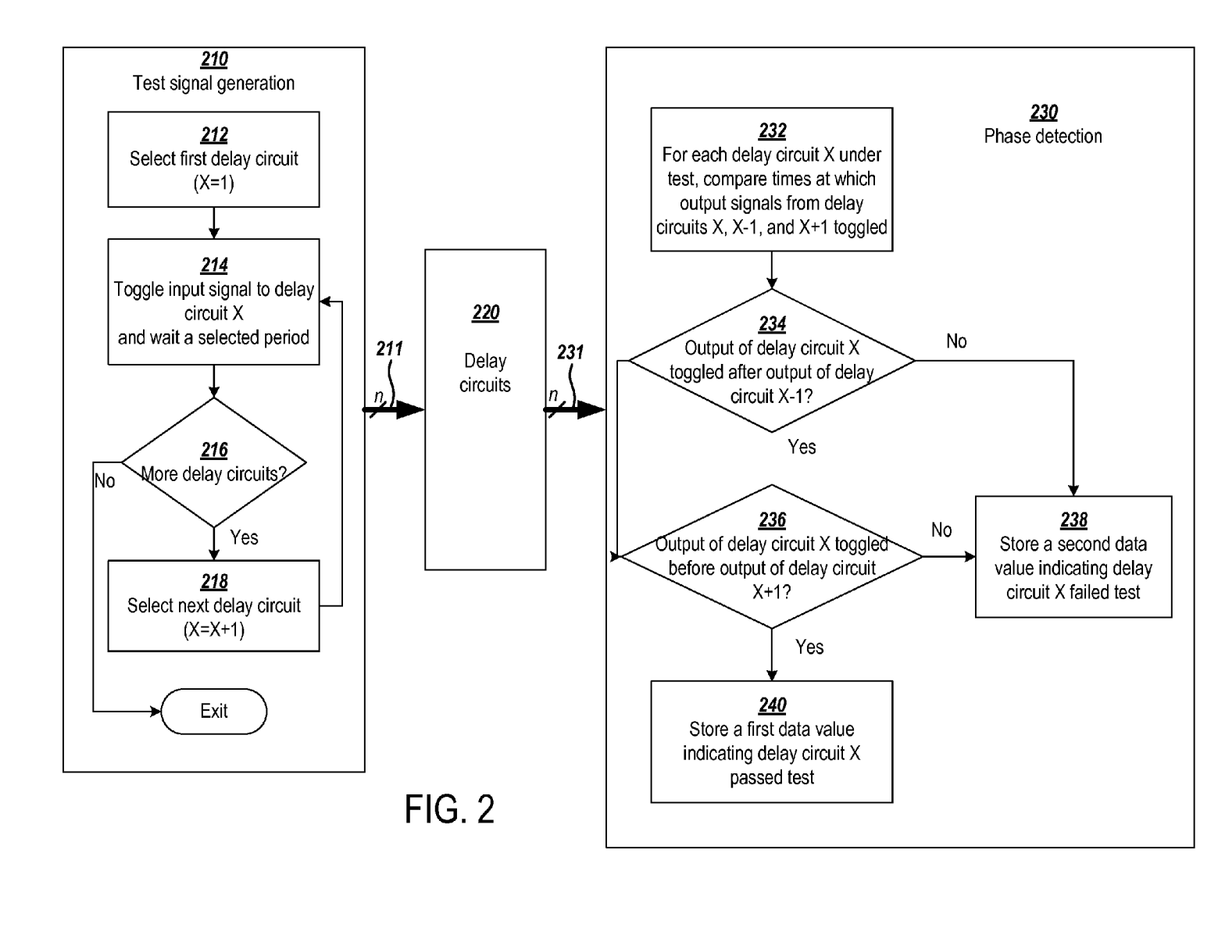
FIG. 2 shows a flowchart of a process for testing delay circuits of an integrated circuit in accordance with one or more embodiments of the invention.

FIG. 2 shows a flowchart of example processes for testing delay circuits in accordance with one or more embodiments of the invention. In this embodiment, input signals to delay circuits 220 are toggled in a sequential order in test signal generation process block 210. Line 211 represents n output signals provided to the delay circuits 220. The process block 210 shows the operations performed in toggling the input signals to the delay circuits in sequential order. A first delay circuit (X=1) is selected at process block 212. The input signal to the delay circuit is toggled at process block 214, and the process waits for a selected period of time. If there are more delay circuits to which to toggle input signals (decision block 216), the next delay circuit is selected at process block 218, and the input signal to that delay circuit is toggled at process block 214. After the input signals to all the delay circuits have been toggled (decision step 216), the waveform generation process exits.

The times at which output signals from the delay circuits 220 toggle are compared in phase detection process block 230. The comparison determines the order in which the output signals from the delay circuits toggle. Line 231 represents n output signals of the delay circuits 220. The blocks within block 230 show the operations performed in determining the order in which the output signals from the delay circuits toggled. For each delay circuit X under test, the times at which output signals of delay circuits X, X−1, and X+1 toggle are compared at process block 232. If the output signal from delay circuit X toggles after the output signal from delay circuit X−1 (decision 234), and the output signal from delay circuit X toggles before the output signal from delay circuit X+1 (decision 236), a first data value is stored at step 240 indicating the phase of delay circuit X is correct. Otherwise, a second data value is stored at step 238 indicating the phase of the delay circuit X is not correct.

In another embodiment, the phase comparison process 230 may store respective second and third data values to distinguish between the phase of delay circuit X being early and being late.

Figure 3:
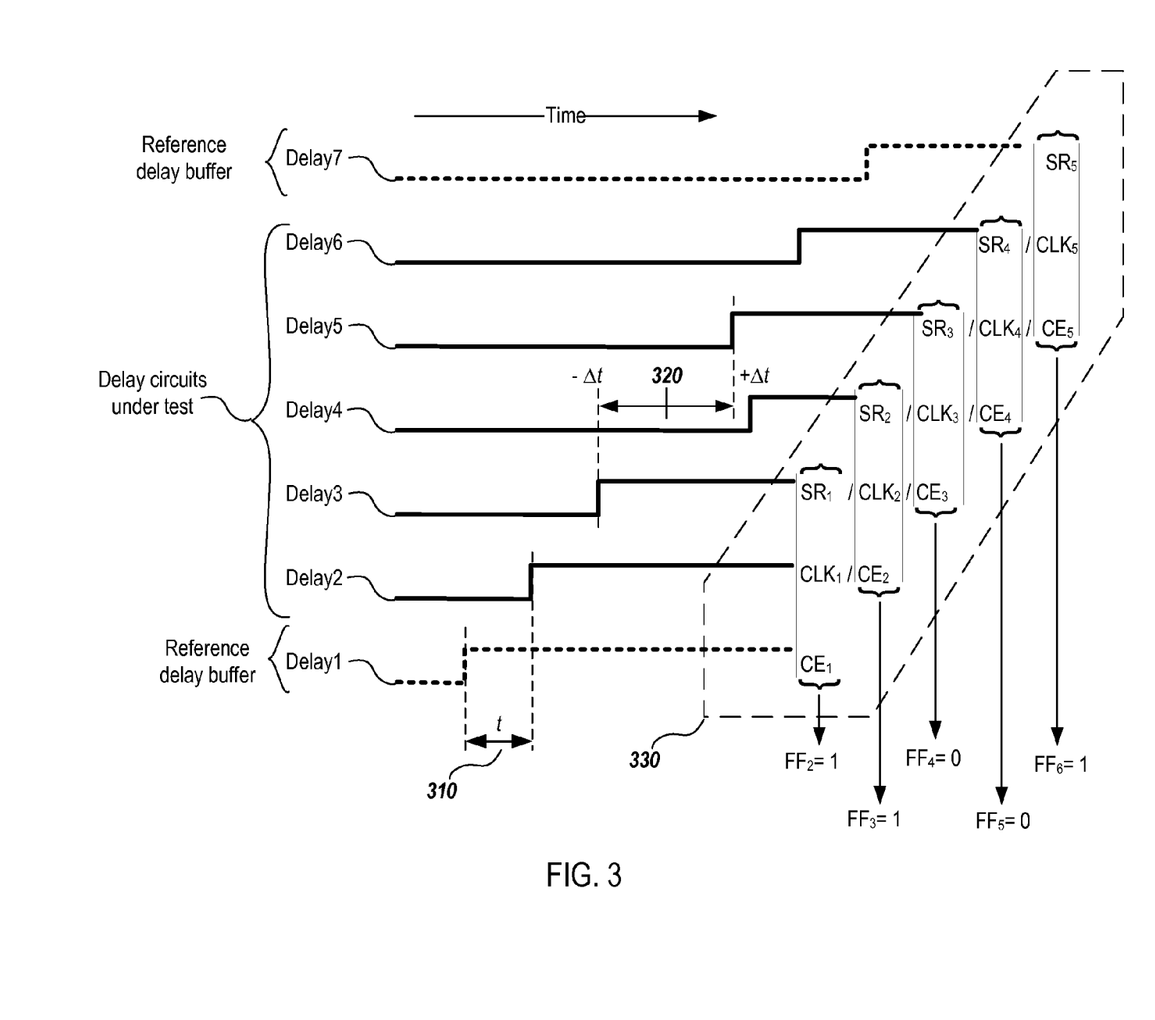
FIG. 3 illustrates the comparison of example output of delay circuits shown in FIG. 2.

FIG. 3 illustrates the timing of example output signals 118 of delay circuits 112, 114-a-114-e, and 116 (1×7) shown in FIG. 1. Signals labeled Delay2 through Delay6 are the signals output from the delay circuits under test and correspond to delay circuits 114-a-114-e shown in FIG. 1. Signals labeled Delay1 and Delay7 correspond to signals output from respective delay buffers 116 and 112 of FIG. 1. These delay buffers may be other instances of delay circuits that are identical to the delay circuits under test or may be buffers configured to approximate the delay of the delay circuits under test.

As illustrated by Delay1 and Delay2, the expected result is for the output signal of each delay circuit X to toggle approximately t units of time (310) after the toggling of the output signal from delay circuit X−1. Assuming correct operation of the other delay circuits, range 320 indicates a tolerable range in which the output signal Delay4 may be toggled. If the output signal Delay4 is toggled outside the range 320 (as shown), an error will be detected. The range 320 is bounded by the detection thresholds −Δt or +Δt, which are dictated by delay buffers 104 of FIG. 1 as discussed above.

The columns 330 of labels of inputs for flip-flops $FF_2$-$FF_6$ (flip-flops 132 of FIG. 1) illustrate the phase comparison of delay circuit output signals as implemented in FIG. 1. The output signal of each delay circuit under test X is compared to the output signals of delay circuits X−1 and X+1 by the comparison circuit. For example, the output signal Delay4 is compared to output signals Delay3 and Delay5 by way of the output signals from flip-flops $FF_3$, $FF_4$, and $FF_5$. In this example, the output signal Delay4 toggles late resulting in the failure of $FF_4$ and $FF_5$ to register the value 1. As a result, the delay circuits producing signals Delay4 and Delay5 will be detected as having an incorrect phase.

One skilled in the art will recognize that a signal indicating a delay circuit failed (early or late) does not necessarily mean that the delay circuit performed incorrectly. For example, delay circuit X may toggle before delay circuit x−1 if: 1) delay circuit X−1 improperly delays the input signal too long and toggles late; or 2) delay circuit X does not delay the signal long enough and toggles early. Assuming only one delay circuit errors at a time for ease of explanation, a discrepancy will result in two delay circuits being indicated as having an incorrect phase. In one embodiment, test results output from phase comparison may be compared to extrapolate which delay circuit is the source of the discrepancy. In one implementation, a second round of testing may be performed in which input signals to the delay circuits are toggled in a reverse sequential order. Table 1 shows an example testing of five delay circuits. The table shows the discrepancies detected when input signals to the delay circuits are toggled in forward and reverse order. In this example, delay 3 has a propagation delay that is not long enough.

TABLE 1

|  | Delay 1 (correct) | Delay 2 (correct) | Delay 3 (early) | Delay 4 (correct) | Delay 5 (correct) |
|---|---|---|---|---|---|
| Incremental toggle order | NA | late | Early | correct | NA |
| Decrementing toggle order | NA | correct | Early | late | NA |

When the input signals to the delay circuits are toggled in a forward sequential order, the resulting order in which the output signals of the delay circuits toggle is Delay1, Delay3, Delay2, Delay4, and Delay5. As a result, the phase comparator circuit indicates delay circuits 2 and 3 are not operating correctly.

When the input signals of the delay circuits are toggled in a reverse sequential order, the resulting order in which the output signals of the delay circuits toggle is Delay5, Delay3, Delay4, Delay2, and Delay1. As a result, the phase comparator circuit indicates delay circuits 3 and 4 are not operating correctly. Because the phase of delay circuit 3 was incorrect both when the input signals were toggled in forward and when toggled in reverse sequential order, the delay circuit can be identified as the source of the discrepancy.

Figure 4:
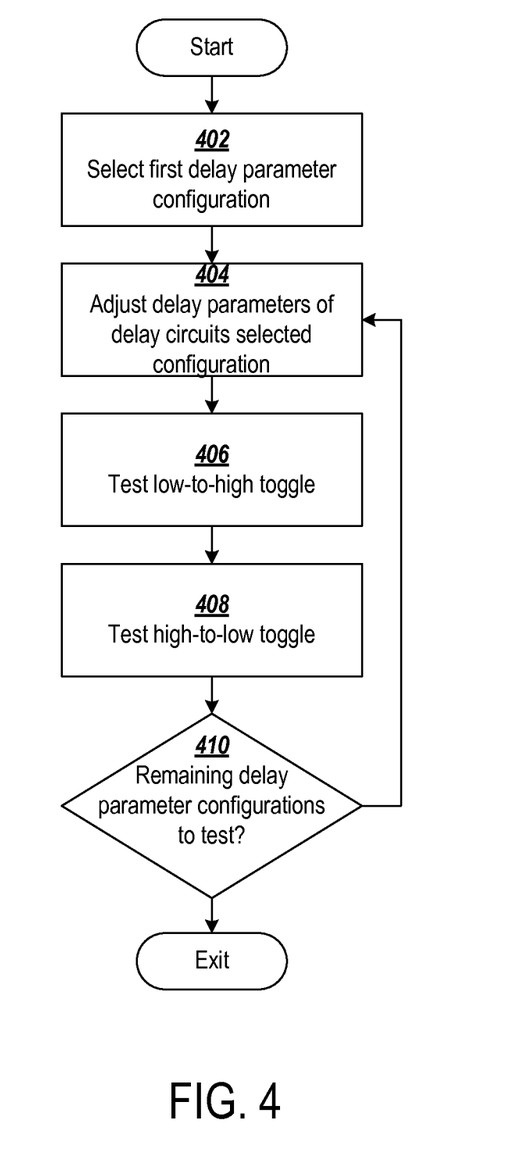
FIG. 4 shows a flowchart of a process for testing several functions of delay circuits in accordance with one or more embodiments of the invention.

Programmable delay circuits may be configurable to operate according to a plurality of different delay parameter configurations. Different delay parameter values may produce results of different accuracy. FIG. 4 shows a flowchart of a process for testing several parameter configurations of delay circuits in accordance with one or more embodiments of the invention. A first delay parameter configuration is selected at process block 402. The plurality of delay circuits are set to the selected parameter configuration at process block 404. The test is conducted as described above at process blocks 210 and 230, testing with the toggling of input signals from low to high at process block 406. Low-to-high and high-to-low transitions may produce different results depending on pull up and pull down circuitry. The test is repeated at process block 408, testing with the toggling of input signals high-to-low.

One skilled in the art will recognize that the order in which different delay parameter configurations are tested may be changed to accommodate a particular application. For example, in another embodiment, low-to-high toggle may be tested at process block 406 for each delay circuit configuration. Following completion of all low-to-high toggle tests, high-to-low toggle may be tested at process block 408 for each delay parameter configuration. Those skilled in the art will also recognize the disclosed embodiments may be used alone or in conjunction with current BIST testing methods. When implemented alongside current BIST methods, only one delay block needs to be tested with BIST to ensure that monotonic delay is observed. Monotonicity of other delay blocks may be confirmed by comparing propagation times of the delay blocks as discussed above. In this manner, one or more embodiments may be implemented to ensure that each delay block has monotonic delays and is defect-free.

Figure 5:
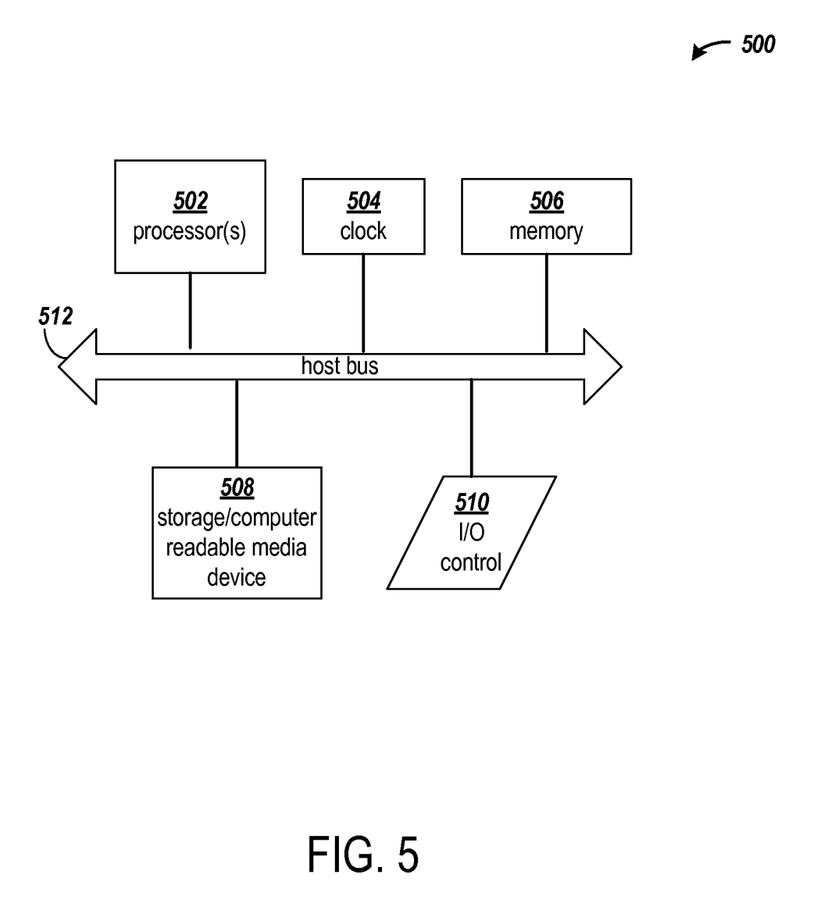
FIG. 5 contains a block diagram of a general purpose processor computing arrangement for performing the processes of one or more embodiments of the invention.

FIG. 5 is a block diagram of an example computing arrangement on which the processes described herein may be implemented using a general-purpose processor. Those skilled in the art will appreciate that various alternative computing arrangements, including one or more processors and a memory arrangement configured with program code, would be suitable for hosting the processes and data structures and implementing the processes of one or more different embodiments of the present invention. The computer code, encoded in a processor executable format, may be stored and provided via a variety of computer-readable storage media or delivery channels such as magnetic or optical disks or tapes, electronic storage devices, or delivered from a remote computer readable storage media as application services over a network.

The computing arrangement 500 includes one or more processors 502, a clock signal generator 504, a memory unit 506, a storage unit 508, and an input/output control unit 510 coupled to host bus 512. The arrangement 500 may be implemented with separate components on a circuit board or may be implemented internally within an integrated circuit. When implemented internally within an integrated circuit, the computing arrangement is otherwise known as a microcontroller.

The architecture of the computing arrangement depends on implementation requirements as would be recognized by those skilled in the art. The processor 502 may be one or more general-purpose processors, or a combination of one or more general-purpose processors and suitable co-processors, or one or more specialized processors (e.g., RISC, CISC, pipelined, etc.).

The memory arrangement 506 typically includes multiple levels of cache memory and a main memory. The storage arrangement 508 may include local and/or remote persistent storage such as provided by magnetic disks (not shown), flash, EPROM, or other non-volatile data storage. The storage unit may be read or read/write capable. Further, the memory 506 and storage 508 may be combined in a single arrangement.

The processor arrangement 502 executes the software in storage 508 and/or memory 506 arrangements, reads data from and stores data to the storage 508 and/or memory 506 arrangements, and communicates with external devices through the input/output control arrangement 510. These functions are synchronized by the clock signal generator 504. The resource of the computing arrangement may be managed by either an operating system (not shown), or a hardware control unit (not shown).

Figure 6:
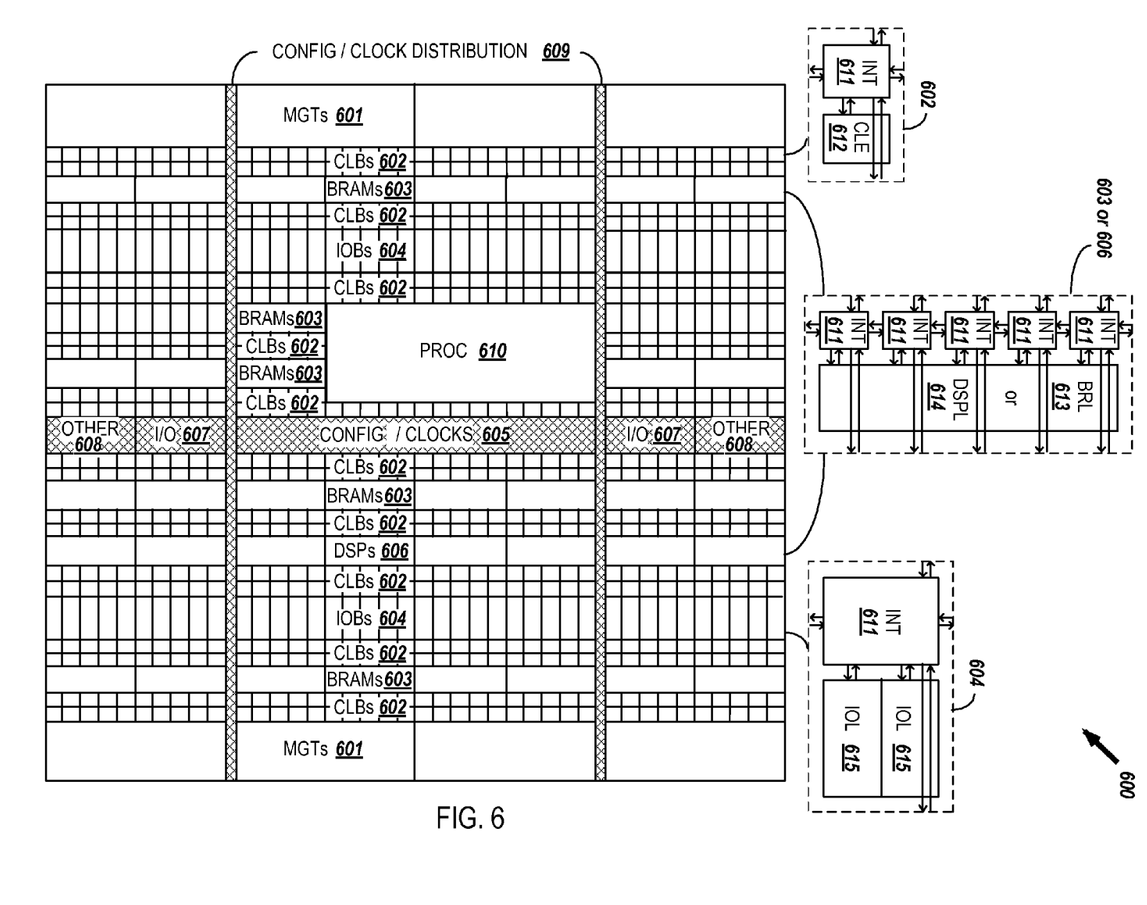
FIG. 6 contains a block diagram of an example programmable integrated circuit that may be configured to test delay circuits in accordance with one or more embodiments of the invention.

FIG. 6 is a block diagram of an example programmable integrated circuit that may be configured to test delay circuits in accordance with one or more embodiments of the invention. Delay testing circuitry, as previously described, may be implemented on the programmable logic and interconnect resources of programmable integrated circuits.

FPGAs can include several different types of programmable logic blocks in the array. For example, FIG. 6 illustrates an FPGA architecture (600) that includes a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing blocks (DSPs) 606, specialized input/output blocks (I/O) 607, for example, e.g., clock ports, and other programmable logic 608 such as digital clock managers, analog-to-digital converters, system monitoring logic, and so forth. Some FPGAs also include dedicated processor blocks (PROC 610) and internal and external reconfiguration ports (not shown).

In some FPGAs, each programmable tile includes a programmable interconnect element (INT) 611 having standardized connections to and from a corresponding interconnect element in each adjacent tile. Therefore, the programmable interconnect elements taken together implement the programmable interconnect structure for the illustrated FPGA. The programmable interconnect element INT 611 also includes the connections to and from the programmable logic element within the same tile, as shown by the examples included at the top of FIG. 6.

For example, a CLB 602 can include a configurable logic element CLE 612 that can be programmed to implement user logic plus a single programmable interconnect element INT 611. A BRAM 603 can include a BRAM logic element (BRL) 613 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 606 can include a DSP logic element (DSPL) 614 in addition to an appropriate number of programmable interconnect elements. An 10B 604 can include, for example, two instances of an input/output logic element (IOL) 615 in addition to one instance of the programmable interconnect element INT 611. As will be clear to those of skill in the art, the actual I/O pads connected, for example, to the I/O logic element 615 are manufactured using metal layered above the various illustrated logic blocks, and typically are not confined to the area of the input/output logic element 615.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

One or more embodiments of the present invention are thought to be applicable to a variety of systems for testing delay elements. Other aspects and embodiments will be apparent to those skilled in the art from consideration of the specification and practice of the invention disclosed herein. Those skilled in the art will appreciate, however, that one or more embodiments of the invention could be implemented to test delay elements on a number of different FPGA architectures, application specific integrated circuit (ASIC) and integrated circuits including programmable logic circuitry and/or circuitry configured to implement the testing methods disclosed herein. It is intended that the specification and illustrated embodiments be considered as examples only, with a true scope and spirit of the invention being indicated by the following claims.

What is claimed is:

1. A circuit for testing a plurality of delay circuits in an integrated circuit (IC), comprising:
   a test signal generator circuit configured to generate a plurality of output signals 1 through N, and in response to an input signal, toggle the plurality of output signals in sequential order from 1 to N with a delay period between the toggle of each output signal X and the toggle output signal X+1 of the N output signals, each output signal being coupled to an input of a respective one of the plurality of delay circuits; and
   a phase detector circuit coupled to outputs of the plurality of delay circuits, the phase detector circuit, for an output signal of each delay circuit X of delay circuits 2 through N−1, configured to:
      output a first signal indicating delay circuit X is operational in response to the output signals of delay circuits X−1, X, and X+1 being toggled in the order X−1 followed by X followed by X+1; and
      output a second signal indicating delay circuit X is not operational in response to the output signals of delay circuits X−1, X, and X+1 being toggled in an order other than X−1 followed by X followed by X+1;
   wherein for each delay circuit X of the plurality of delay circuits, the phase detector includes a flip flop X having a clock input coupled to receive the output signal of delay circuit X, a clock enable input coupled to receive the output signal of delay circuit X−1, a synchronous reset input coupled to receive the output signal of delay circuit X+1, a data input, and a data output that provides a respective output signal of the phase detector circuit.

2. The circuit of claim 1, wherein the test signal generator circuit includes:
   a plurality of outputs corresponding to respective ones of the plurality of output signals; and
   a chain of buffer delay circuits having an input coupled to an input of the test signal generator circuit and including, for each output signal X of the test signal generator circuit, a buffer delay circuit having an input coupled to output signal X of the test signal generator circuit, configured to delay a signal for the delay period, and having an output that provides output signal X+1 of the test signal generator circuit.

3. The circuit of claim 1, wherein the delay period is adjustable.

4. The circuit of claim 1, wherein the phase detector includes a reset input coupled to a global reset port of each flip flop of the phase detector.

5. The circuit of claim 1, further comprising a parallel-loadable, serial-in-serial-out shift register, having a plurality of parallel inputs coupled to respective output signals of the phase detector circuit.

6. The circuit of claim 1, wherein the phase detector circuit, responsive to a high-low toggle at the input of the test signal generator circuit, inverts signals delivered from the plurality of delay circuits to clock inputs, clock enable inputs, and synchronous reset inputs of each flip flop.

7. The circuit of claim 1, wherein delay circuit 1 and delay circuit N are buffer circuits, each configured to delay an input signal by an amount equal to the delays provided by the delay circuits 2 through N−1.

8. The circuit of claim 1, wherein
   the phase detector circuit is configured to condition performance of outputting the second signal on the output signal X being toggled before the output signal X−1; and
   the phase detector is further configured to output a third signal in response to the output signal X being toggled after the output signal X+1.

9. A method for testing delay circuits in an integrated circuit (IC), comprising:
   toggling input signals to a plurality of N delay circuits in sequential order from 1 to N, with a delay period between the toggle of the input signal to each delay circuit X and the toggle of the input signal to delay circuit X+1 of the plurality of delay circuits; and
   for each delay circuit X of delay circuits 2 through N−1, performing operations including:
      determining an order in which output signals of delay circuits X−1, X, and X+1 toggle;
      wherein determining the order in which the output signals of delay circuits X−1, X, and X+1 toggle includes:
         inputting the output signal of delay circuit X−1 to a clock enable input of a flip-flop;
         inputting the output signal of delay circuit X to a clock input of the flip-flop; and
         inputting the output signal of delay circuit X+1 to a synchronous reset input of the flip-flop;
      in response to the output signals of delay circuits X−1, X, and X+1 being toggled in the order X−1 followed by X followed by X+1, storing a first data value indicating delay circuit X is operational; and
      in response to the output signals of delay circuits X−1, X, and X+1 being toggled in an order other than X−1 followed by X followed by X+1, storing a second data value indicating delay circuit X is not operational.

10. The method of claim 9, wherein the toggling of input signals of the plurality of N delay circuits includes:
   generating N test waveforms 1 to N, each test waveform X of the N test waveforms containing a signal transition at a time that is separated from the signal transition of each of test waveforms X−1 and X+1 by approximately the delay period.

11. The method of claim 10, wherein generating N test waveforms includes:
   receiving the test waveform 1; and for each test waveform X of test waveforms 1 through N−1, delaying test waveform X by the delay period and producing test waveform X+1 from delayed test waveform X.

12. The method of claim 9, wherein the toggling of input signals to the plurality of N delay circuits toggles the input signals from low to high, the method further comprising:
toggling input signals to the plurality of N delay circuits from high to low in sequential order from delay circuit 1 to delay circuit N with a delay period between the toggle of the input signal to each delay circuit X and the toggle of the input signal to delay circuit X+1 of the plurality of N delay circuits; and
repeating the determining step.

13. The method of claim 9, further comprising:
configuring the delay circuits to operate in a first mode of operation prior to toggling inputs;
configuring the delay circuits to operate in a second mode of operation; and
while the delay circuits are configured in the second mode of operation, repeating the toggling and determining steps.

14. The method of claim 9, wherein storing the second data value is conditioned on the output signal X being toggled before the output signal X−1, the method further comprising, in response to the output signal X being toggled after the output signal X+1, storing a third data value indicating delay circuit X is not operational.

15. An article of manufacture, comprising:
a non-transitory storage medium configured with configuration data that when loaded onto a programmable integrated circuit cause a set of programmable circuits to operate as built-in self test (BIST) circuitry, the BIST circuitry configured to perform the operations including:
toggling input signals to a plurality of N delay circuits in sequential order from 1 to N, with a delay period between the toggle of the input signal to each delay circuit X and the toggle of the input signal to delay circuit X+1 of the plurality of delay circuits; and
for each delay circuit X of delay circuits 2 through N−1, performing operations including:
determining an order in which output signals of delay circuits X−1, X, and X+1 toggle;
wherein determining the order in which the output signals of delay circuits X−1, X, and X+1 toggle includes:
inputting the output signal of delay circuit X−1 to a clock enable input of a flip-flop;
inputting the output signal of delay circuit X to a clock input of the flip-flop; and
inputting the output signal of delay circuit X+1 to a synchronous reset input of the flip-flop;
in response to the output signals of delay circuits X−1, X, and X+1 being toggled in the order X−1 followed by X followed by X+1, outputting a first data value indicating delay circuit X is operational; and
in response to the output signals of delay circuits X−1, X, and X+1 being toggled in an order other than X−1 followed by X followed by X+1, outputting a second data value indicating delay circuit X is not operational.

16. The article of manufacture of claim 15, wherein the toggling of input signals of the plurality of N delay circuits includes:
generating N test waveforms 1 to N, each test waveform X of the N test waveforms containing a signal transition at a time that is separated from the signal transition of each of test waveforms X−1 and X+1 by approximately the delay period.

17. The article of manufacture of claim 15, wherein generating N test waveforms includes:
receiving the test waveform 1; and
for each test waveform X of test waveforms 1 through N−1, delaying test waveform X by the delay period and producing test waveform X+1 from delayed test waveform X.

* * * * *